United States Patent [19]
Wen

[11] Patent Number: 5,910,666
[45] Date of Patent: Jun. 8, 1999

[54] HIGH-VOLTAGE METAL-OXIDE SEMICONDUCTOR (MOS) DEVICE

[75] Inventor: Jemmy Wen, Hsinchu, Taiwan

[73] Assignee: United Microelectronics Corporation, Taiwan

[21] Appl. No.: 08/928,627

[22] Filed: Sep. 12, 1997

Related U.S. Application Data

[62] Division of application No. 08/749,794, Nov. 15, 1996, Pat. No. 5,696,009.

[30] Foreign Application Priority Data

Aug. 21, 1996 [TW] Taiwan .................................. 85111563

[51] Int. Cl.$^6$ .............................. H01L 29/76; H01L 29/80
[52] U.S. Cl. .......................... 257/288; 257/330; 257/329; 257/339; 257/394
[58] Field of Search ..................................... 257/288, 329, 257/339, 341, 342, 394, 396, 398, 34, 395, 400, 487, 488, 330

[56] References Cited

U.S. PATENT DOCUMENTS

| | | | |
|---|---|---|---|
| 4,803,173 | 2/1989 | Sill et al. ................................ | 257/330 |
| 4,860,084 | 8/1989 | Shibata ..................................... | 257/330 |
| 5,614,751 | 3/1997 | Yilmaz et al. ........................... | 257/394 |

*Primary Examiner*—Carl Whitehead, Jr.
*Attorney, Agent, or Firm*—Rabin & Champagne, P.C

[57] ABSTRACT

A high-voltage MOS (metal-oxide semiconductor) device and a method for fabricating the same is provided. The high-voltage MOS device features the forming of trench-type source/drain structure in substitute of conventional highly doped structure formed by implantation. The improved structure allows the source/drain regions to occupy a small area for layout on the chip. In addition, the forming of the trench-type source/drain structure in N-wells allows an increased current path from the source/drain regions to drift regions, meaning that the conductive path for the current is not limited to only the junction between the source/drain regions and the drift regions as in conventional structures. Moreover, since the trench-type source/drain structure extends upwards from the inside of N-wells to above the surface of isolation layers, metal contact windows can be formed above the isolation layers, thus preventing the occurrence of leakage current.

8 Claims, 6 Drawing Sheets

HIGH-VOLTAGE METAL-OXIDE SEMICONDUCTOR (MOS) DEVICE

This is a Division of application Ser. No. 08/749,794, filed Nov. 15, 1996 now U.S. Pat. No. 5,696,009.

BACKGROUND OF THE INVENTION

1. Field of the Invention

This invention relates to semiconductors, and more particularly, to a high-voltage MOS (metal-oxide semiconductor) device and a method for fabricating the same. This MOS device features an increased conductive path for electric current therein and a small area for layout on the chip.

2. Description of Related Art

Conventional MOS devices are generally provided with isolation layers and underlying drift regions so as to separate the source/drain regions from the gates such that the MOS devices can be operable under high-voltage conditions. The semiconductor structure of such a MOS device is described in more detail in the following with reference to FIGS. 1A through 1D.

Referring first to FIG. 1A, a substrate 110 such as a P-type silicon substrate is subjected to thermal oxidation so as to form a pad oxide 111 on the top surface thereof After that, a silicon nitride 112 is formed over the pad oxide 111 by chemical-vapor deposition (CVD). A photolithographic and etching process is then conducted on the wafer for pattern definition and removal of selected portions of the silicon nitride 112 so as to form openings 113 in the silicon nitride 112. The exposed surfaces of the pad oxide 111 are intended for the forming of drift regions in later steps. Subsequently, an ion implantation process is conducted on the wafer so as to implant an N-type dopant such as phosphor ions through the openings 113 into those regions indicated by the reference numeral 14 in the substrate 110 so as to form lightly-doped regions therein.

Referring next to FIG. 1B, in the subsequent step, the wafer is subjected to thermal oxidation such as wet oxidation so as to form isolation layers 115 in the openings 113. The isolation layers 115 can be oxide layers, for example, that are formed by local oxidation of silicon (LOCOS). Through this process, the implanted phosphor ions are also driven in to form N-type lightly-doped drift regions 114.

Referring onward to FIG. 1C, in the subsequent step, an etching process such as wet etching is conducted on the wafer so as to remove the silicon nitride 112 and the pad oxide 111 successively. After that, a gate oxide layer 116 is formed on the substrate 110 either by the CVD method or by thermal oxidation. Subsequently, a conductive layer 117 such as highly-doped polysilicon layer is formed over the gate oxide layer 116 by the CVD method. A photolithographic and etching process is then conducted on the wafer for pattern definition and removal of selected portions of both the conductive layer 117 and gate oxide layer 116 so as to form a gate 118. Next, the gate 118 and the isolation layers 115 are used together as a mask to conduct an ion implantation process on the wafer so as to implant an N-type dopant, such as phosphor ions, into the substrate 110. The doped regions are further heated so as to drive in the implanted ions to form N-type lightly-doped regions 119. Then, the gate 118 and the isolation layers 115 are used together again as a mask to conduct a second ion implantation process on the wafer so as to implant a dopant such as arsenic ions into the substrate 110. The doped regions are further heated so as to drive in the implanted ions to form $N^+$ heavily-doped source/drain regions 120.

Referring further to FIG. 1D, in the subsequent step, a planarized insulating layer 121 such as borophosphosilicate glass (BPSG) is formed over the wafer. Thereafter, a photolithographic and etching process is conducted on the wafer for removal of selected portions of the planarized insulating layer 121 so as to form the contact holes 122 which penetrate through the planarized insulating layer 121 to expose the source/drain regions 120. Then the contact holes 122 are filled with a metal such as aluminum so as to form contact windows 123.

It is a drawback of the foregoing MOS device that, since the junction between the source/drain regions 120 and the drift regions 114 is small in cross area, the current flowing therethrough is limited to a small magnitude only.

A conventional solution to increase the current is to increase the area of the source/drain regions so as to increase the cross area of the junction. However, this scheme correspondingly increases the layout area of the source/drain regions on the wafer and thus is contradictory to the layout rules of the MOS device.

SUMMARY OF THE INVENTION

It is therefore a primary objective of the present invention to provide a high-voltage MOS device in which the current flow path is not limited to the junction between the source/drain regions and the drift regions so that the current can be increased.

It is another objective of the present invention to provide a high-voltage MOS device whose source/drain regions are only allowed to occupy a small area for layout on the chip.

It is still another objective of the present invention to provide a method for fabricating the foregoing high-voltage MOS device.

In accordance with the foregoing and other objectives of the present invention, a new and improved semiconductor structure and method for fabricating a high-voltage MOS device is provided. The high-voltage MOS device features trench-type source/drain regions that are formed by filling polysilicon in trenches formed on isolation layers, such that the conductive path from the trench-type source/drain regions to the drift regions can be increased. This also allows the source/drain regions to occupy only a small area for layout on the chip.

The method of the invention includes a first step of preparing a first-type substrate, and forming successively a pad oxide layer and a silicon nitride layer over the substrate, a second step of forming a photoresist layer and conducting a photolithographic and etching process on the photoresist layer to define the photoresist layer as mask for ion implantation of a second-type dopant into said substrate so as to form a plurality of wells in the substrate; a third step of selectively removing portions of the silicon nitride layer and using the remaining portions of the silicon nitride layer as mask for ion implantation of a second-type dopant into said substrate; a fourth step of forming an isolation layer and a plurality of drift regions beneath the isolation layer; a fifth step of removing the silicon nitride layer and the pad oxide layer; a sixth step of forming a plurality of trenches at selected regions which penetrate through the isolation layer and the drift regions to the inside of the wells; a seventh step of forming a first conductive layer which fills up the trenches; an eighth step of selectively removing the first conductive layer, the remaining portions thereof serving as source/drain regions for the MOS device; a ninth step of forming a gate oxide layer and a second conductive layer successively; and a final tenth step of selectively removing portions of the gate oxide layer and the second conductive layer with the remaining portions thereof serving as a gate for the MOS device.

The high-voltage MOS device fabricated by the foregoing method has a wafer structure including at least a gate layer formed over the active region; a plurality of wells formed beneath the isolation layer; a plurality of drift regions formed beneath the isolation layer and above the wells; and at least a pair of source/drain regions which penetrate through the isolation layer and the drift regions to the inside of the wells.

The invention has the following advantages. First, an additional current can flow from the bottom portion of the source/drain regions to the drift regions, thus increasing the conductive path in the MOS device, meaning that the conductive path for the current is not limited to the junction between the source/drain regions and the drift regions. Second, the invention allows the source/drain regions to occupy only a small area for layout on the chip. Third, the metal contact windows are formed over the conductive layers above the isolation layers, which prevents the occurrence of leakage current in the MOS device.

BRIEF DESCRIPTION OF DRAWINGS

The invention can be more fully understood from the following detailed description of the preferred embodiment reference made to the accompanying drawings, wherein.

DETAILED DESCRIPTION OF PREFERRED EMBODIMENT

A preferred embodiment of the high-voltage MOS device according to the present invention is fabricated by a process described in the following with reference to FIGS. 2A through 2F. In the following detailed disclosure of the invention, the MOS device is based on a P-type silicon substrate. However, the MOS device can also be based on an N-type silicon substrate.

Figure 1A:
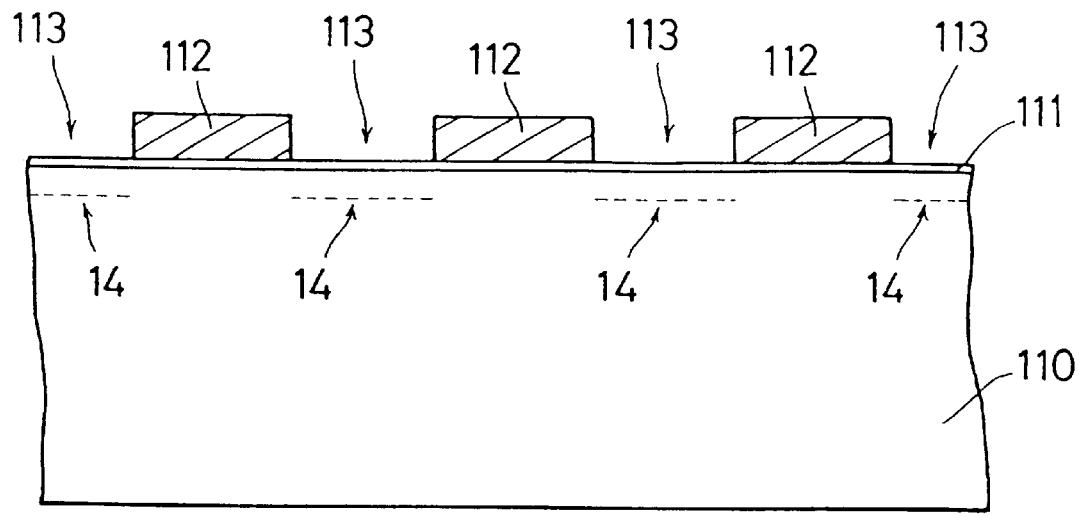
FIGS. 1A through 1D are sectional diagrams used to depict a conventional method for fabricating a conventional high-voltage MOS device.
Figure 1B:
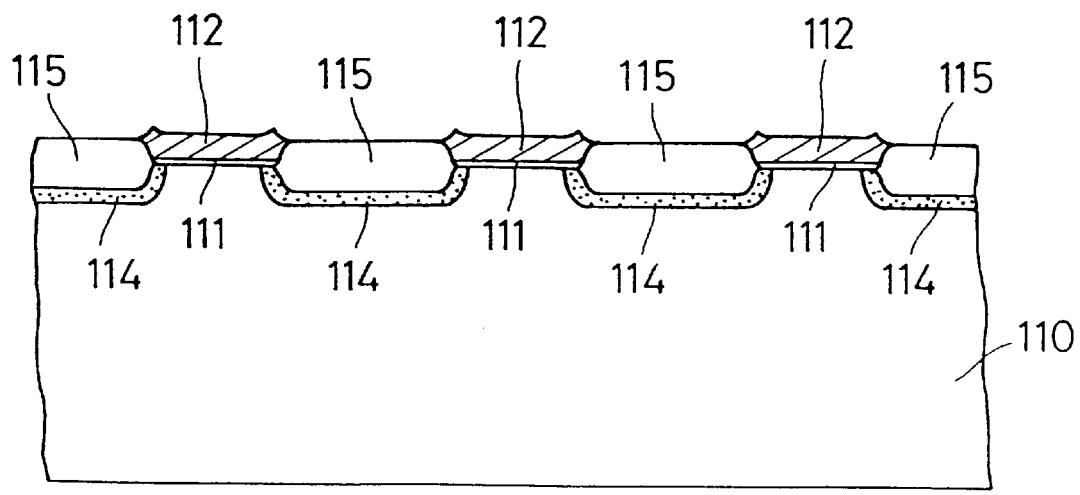
Figure 1C:
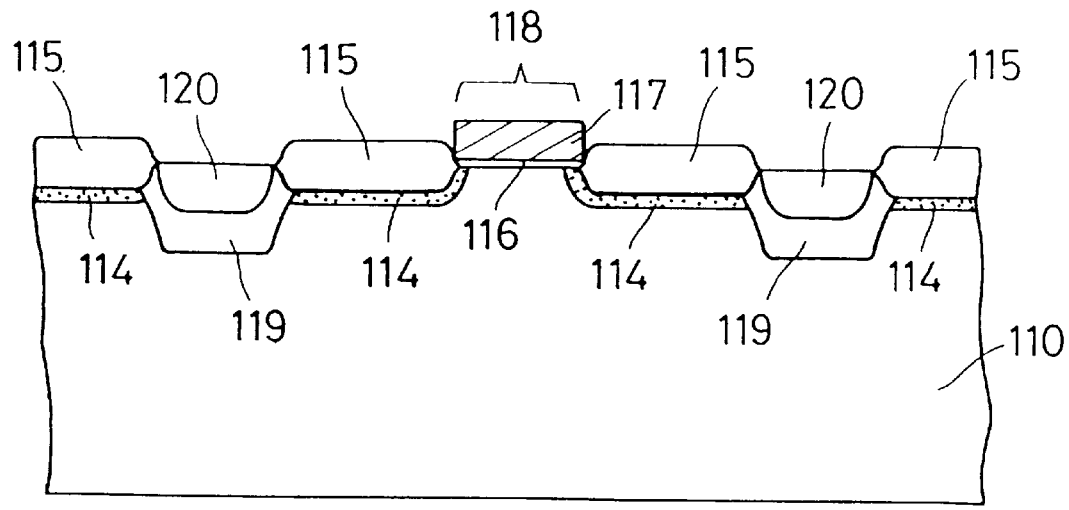
Figure 1D:
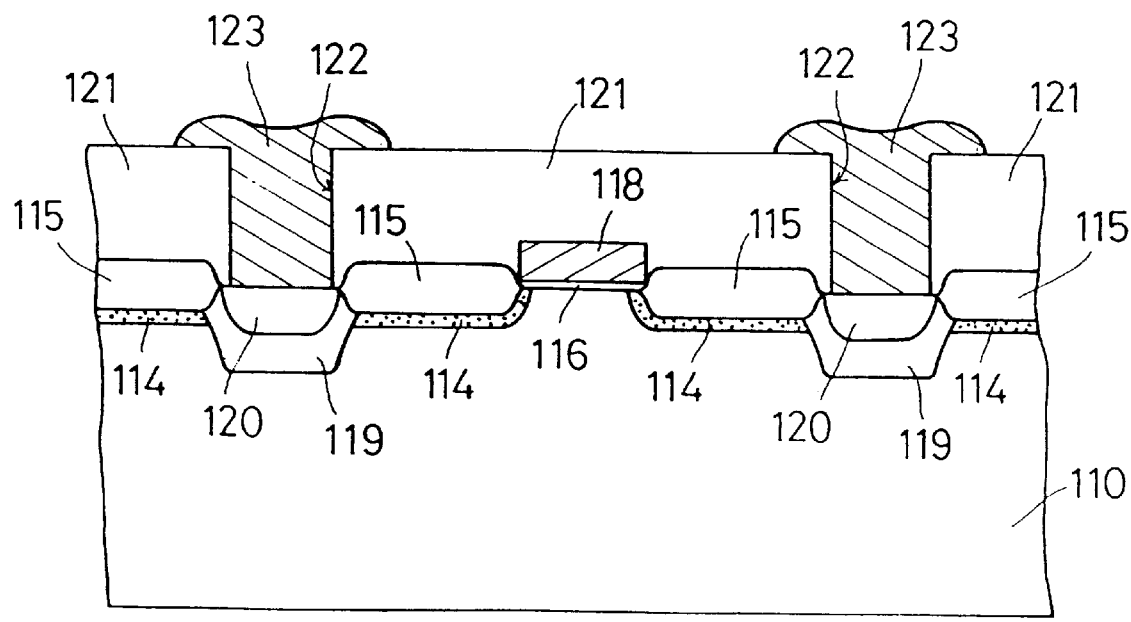
Figure 2A:
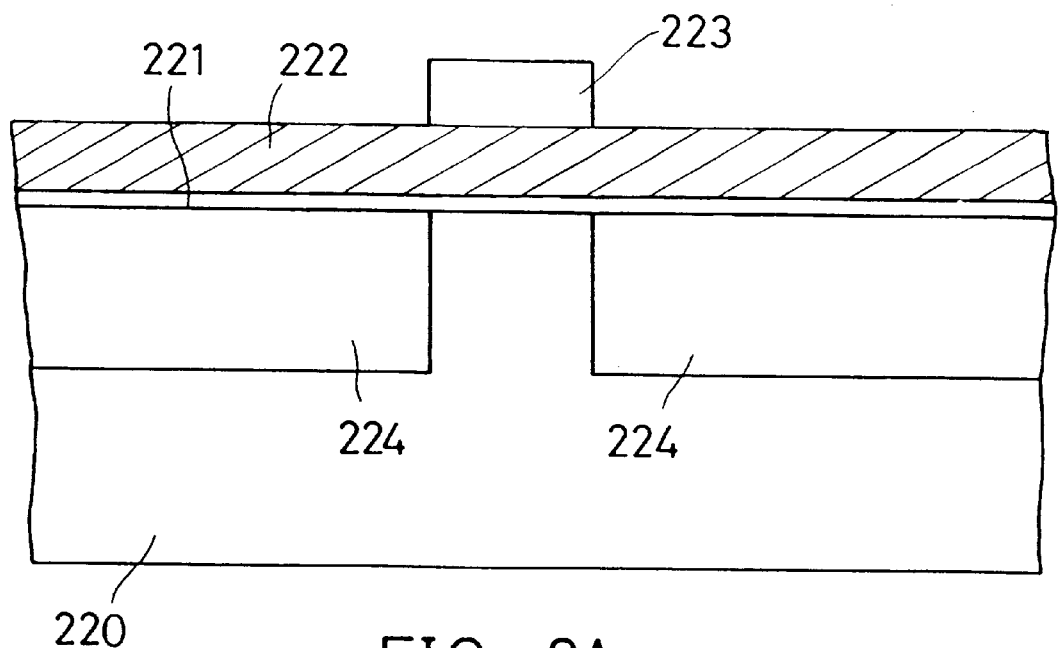
FIGS. 2A through 2G are sectional diagrams used to depict a method for fabricating a high-voltage MOS device according to the present invention.

Referring first to FIG. 2A, a substrate 220 such as a P-type silicon substrate is prepared, and then a pad oxide layer 221 and a silicon nitride layer 222 are successively formed over the substrate 220. Subsequently, a photoresist layer 223 is coated over the wafer and then selectively removed by a photolithographic and etching process to define the location where an N-well is to be formed. Thereafter, the remaining portion of the photoresist layer 223 is used as a mask to implant an N-type dopant such as arsenic ions into the substrate 220. Heat is also applied to the wafer during this process so as to drive in the implanted N-type impurities to form thereby a plurality of N-wells 224 in the substrate 220. Then, the photoresist layer 223 is removed.

Figure 2B:
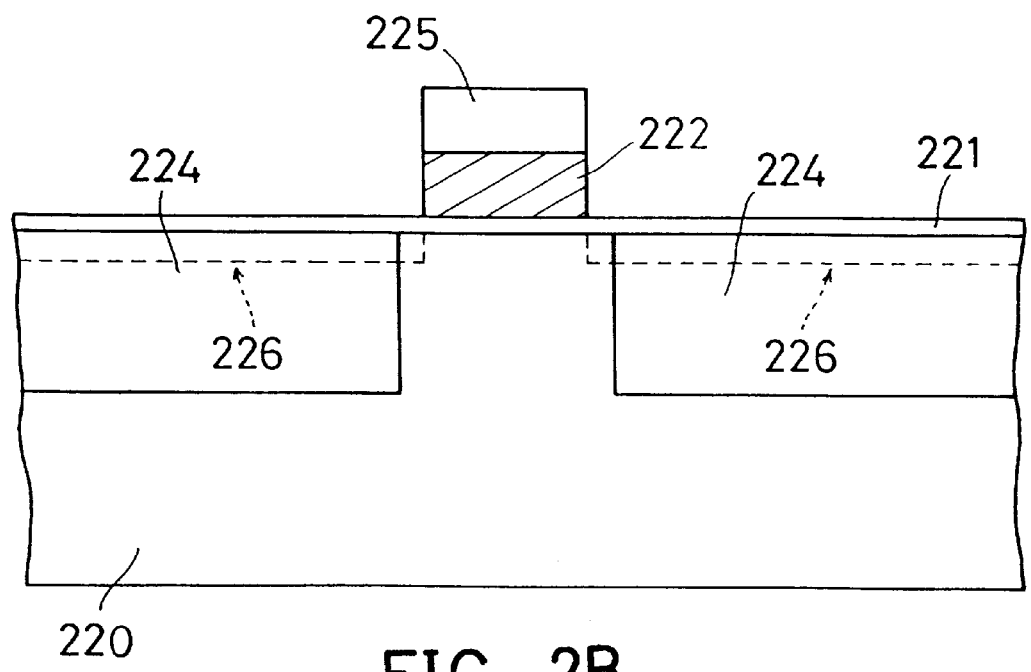

Referring next to FIG. 2B, in the subsequent step, a photoresist layer 225 is coated over the wafer and selectively removed by a photolithographic and etching process to define active regions. Following this, the pad oxide layer 221, the silicon nitride layer 222, and the photoresist layer 225 are used together as a mask to implant an N-type dopant such as phosphor ions into the substrate 220 so as to form lightly-doped regions at the locations designated by the reference numeral 226 on the substrate 220.

Figure 2C:
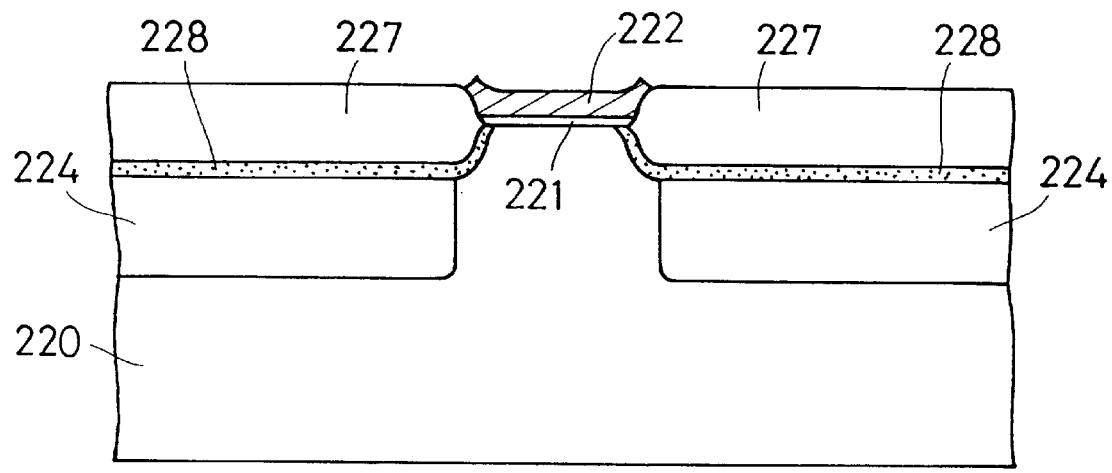

Referring next to FIG. 2C, in the subsequent step, the photoresist layer 225 is removed, and then an isolation layer 227 such as a field oxide layer is formed by local oxidation of silicon (LOCOS) over the wafer. Through this process, the N-type impurities doped in the regions 226 (see FIG. 2B) is driven in to form a plurality of drift regions 228 beneath the isolation layer 227.

Figure 2D:
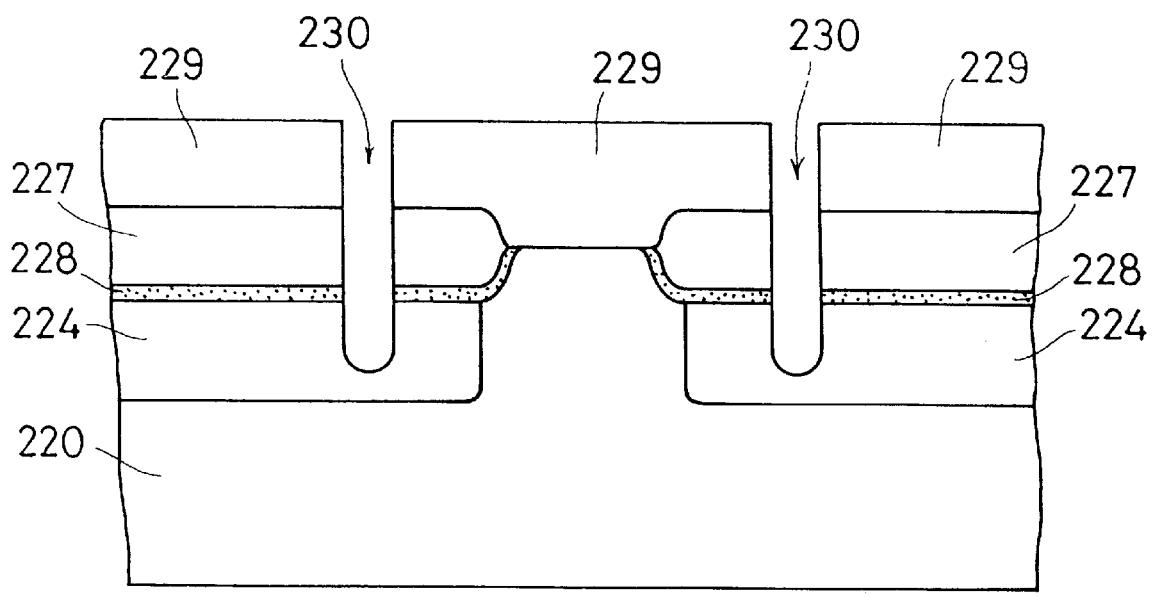

Referring onward to FIG. 2D, in the subsequent step, an etching process such as wet etching is conducted on the wafer so as to remove the silicon nitride layer 222 and the pad oxide layer 221 altogether. Thereafter, a photoresist layer 229 is coated over the wafer and selectively removed by a photolithographic and etching process to define the locations where the trenches are to be formed. The photoresist layer 229 is then used as a mask to gradually etch away the uncovered portions underneath until reaching the inside of the N-wells 224, thus forming trenches 230 in the wafer.

Figure 2E:
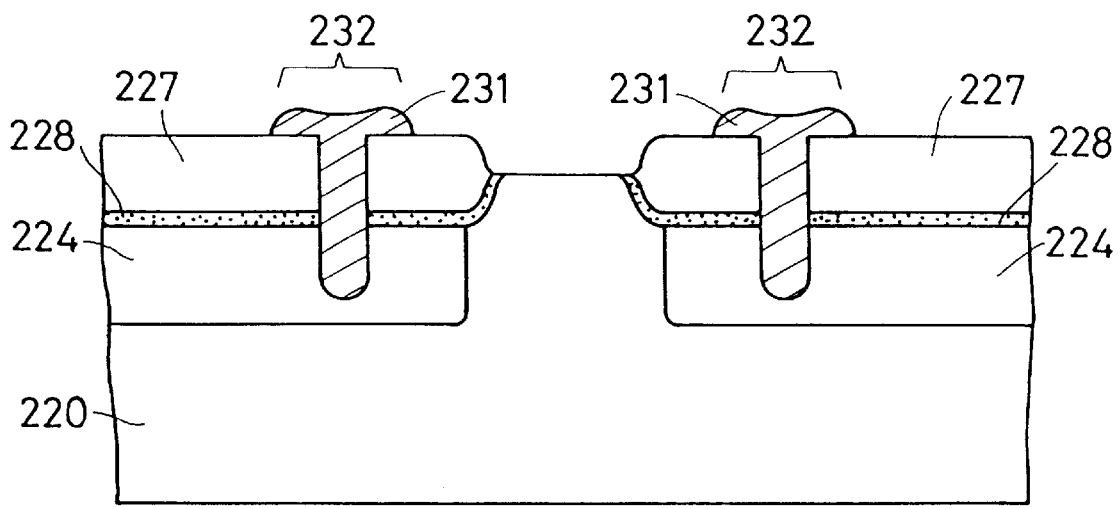

Referring next to FIG. 2E, in the subsequent step, the photoresist layer 229 is removed, and then a first conductive layer 231, such as highly-doped polysilicon layer, is formed by chemical-vapor deposition (CVD) over the wafer. The first conductive layer 231 fills up the trenches 230 and covers the isolation layer 227. Subsequently, the first conductive layer 231 is selectively removed by a photolithographic and etching process. The remaining portions of the first conductive layer 231 serve as a pair of source/drain regions 232 for the MOS device.

Figure 2F:
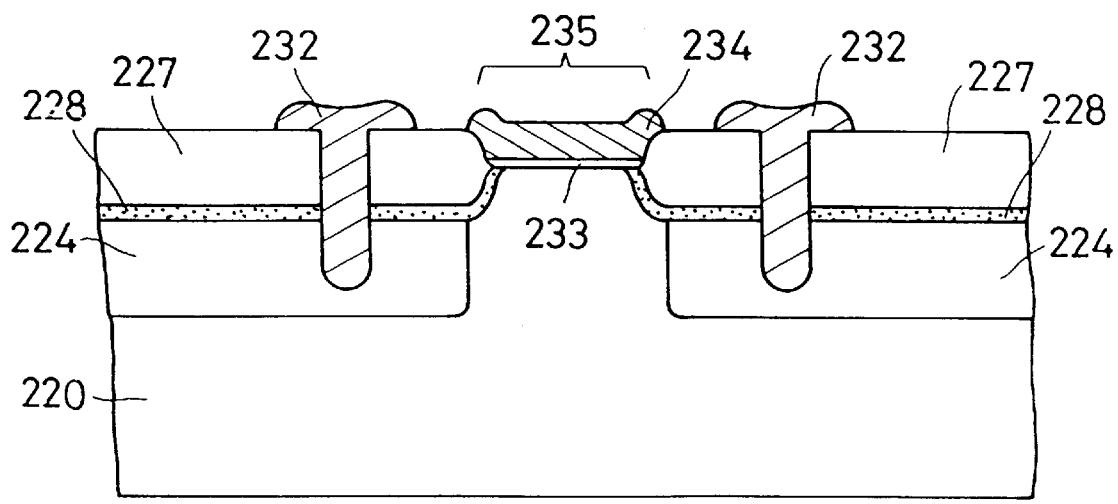

Referring further to FIG. 2F, in the subsequent step, a gate oxide layer 233 and a second conductive layer 234 are successively formed on the wafer by the CVD method. The second conductive layer 234 can be a highly-doped polysilicon layer, for example. After that, the second conductive layer 234 and the gate oxide layer 233 are selectively removed by another photolithographic and etching process, with the remaining portions thereof serving as a gate 235 for the MOS device.

Figure 2G:
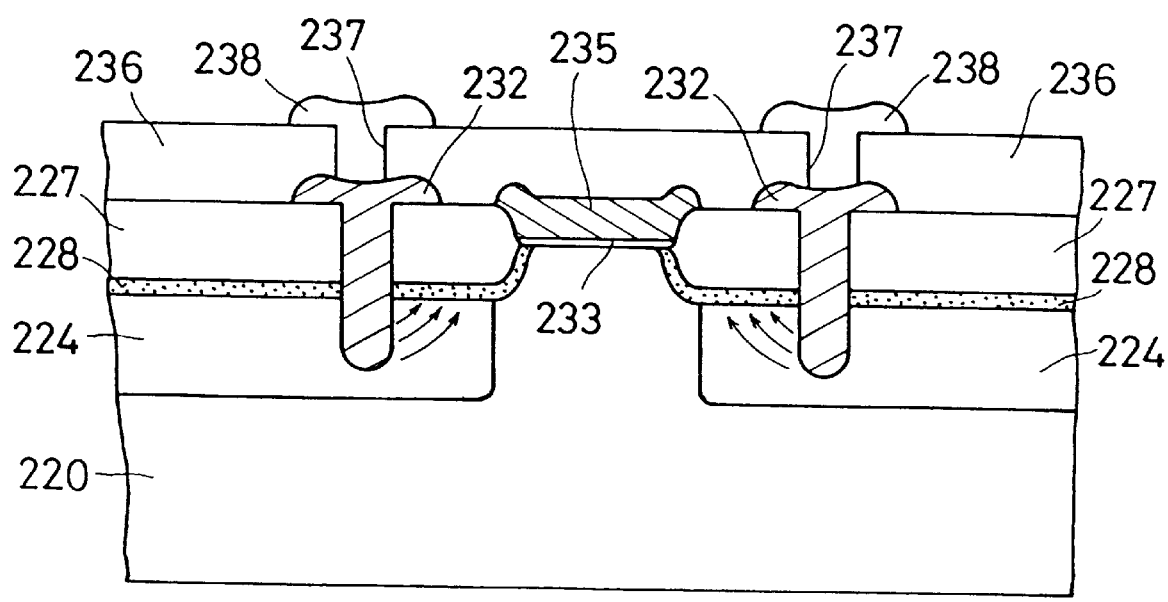

Referring finally to FIG. 2G, a planarized insulating layer 236 such as a layer of borophosphosilicate glass (BPSG) is formed over the wafer. After that, the insulating layer 236 is selectively removed so as to form a plurality of contact window holes 237 therein. These contact window holes 237 expose the top surfaces of source/drain regions 236. Subsequently, a metal such as aluminum is filled into the contact window holes 237, thus forming contact windows 238 which will be used to electrically connect the source/drain regions 236 to other external circuits. All the subsequent processes to complete the fabrication of the chip are conventional processes and not related to the scope of the invention, so that description thereof will not be given.

In conclusion, the high-voltage MOS device of the invention features the forming of the trench-type source/drain regions 232 which extend from the inside of the N-wells 224 upwards to above the top surface of the isolation layer 227. From this, it is apparent to those skilled in the art of semiconductor technology that the invention has the following advantages. First, an additional current can flow from the bottom portion of the source/drain regions 232 to the drift regions 228, as indicated by the arrows in FIG. 2G. This increases the conductive path in the MOS device, meaning that the conductive path for the current is not limited to the junction between the source/drain regions 232 and the drift regions 228. The overall current is thus increased. Second, this trench-type structure allows the source/drain regions to occupy a small area for layout on the chip. Third, since the metal contact windows are formed over the conductive layers above the isolation layers, the occurrence of leakage current in the MOS device will be prevented.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A high-voltage MOS device based on a substrate having an active region defined thereon, the substrate being formed with an isolation layer surrounding the active region, said high-voltage MOS device comprising:

at least a gate layer formed over the active region, a plurality of wells formed beneath the isolation layer;

a plurality of drift regions formed beneath the isolation layer and above the wells;

at least a pair of source/drain regions which penetrate through the isolation layer and the drift regions to the inside of the wells.

2. The high-voltage MOS device of claim 1, wherein the substrate is a P-type silicon substrate and said wells are N-type doped regions.

3. The high-voltage MOS device of claim 1, wherein the substrate is an N-type silicon substrate and said wells are P-type doped regions.

4. The high-voltage MOS device of claim 1, wherein the isolation layer is a field oxide layer.

5. The high-voltage MOS device of claim 1, wherein said wells and said gate layer is separated by a distance.

6. The high-voltage MOS device of claim 1, wherein said source/drain regions are formed by a first conductive layer.

7. The high-voltage MOS device of claim 6, wherein said first conductive layer is a highly-doped polysilicon layer.

8. The high-voltage MOS device of claim 1, further comprising:

at least two contact windows respectively electrically connected to said source/drain regions.

* * * * *